(12) United States Patent
Pastor

(10) Patent No.: US 6,279,490 B1
(45) Date of Patent: Aug. 28, 2001

(54) EPICYCLIC STAGE

(75) Inventor: Manuel G. Pastor, Berkeley, CA (US)

(73) Assignee: Etec Systems, Inc., Hayward, CA (US)

( * ) Notice: Subject to any disclaimer, the term of this patent is extended or adjusted under 35 U.S.C. 154(b) by 0 days.

(21) Appl. No.: 09/414,612

(22) Filed: Oct. 8, 1999

(51) Int. Cl.$^7$ .................................................. A47B 57/00
(52) U.S. Cl. ............................................... 108/94; 108/22
(58) Field of Search ................................ 108/20, 21, 22, 108/103, 94, 95; 74/16, 813 R; 298/349.1; 211/56, 58, 70, 78, 129.1, 131.1, 144, 163

(56) References Cited

U.S. PATENT DOCUMENTS

| | | | |
|---|---|---|---|
| 434,414 | * | 8/1890 | Culp ........................................ 108/22 |
| 1,254,983 | * | 1/1918 | Chadwick ............................... 108/22 |
| 1,472,348 | * | 10/1923 | Whittemore ............................ 108/94 |
| 2,103,175 | * | 12/1937 | Prins ....................................... 108/22 |
| 2,181,021 | * | 11/1939 | Lockwood et al. ................. 108/22 X |
| 2,324,343 | * | 7/1943 | Wjarton ............................. 108/22 X |
| 3,245,545 | * | 4/1966 | Lortie ................................. 108/94 X |
| 3,897,063 | * | 7/1975 | Lehwalder ....................... 108/103 X |
| 4,653,408 | * | 3/1987 | Nagashima et al. .................... 108/20 |
| 4,656,951 | * | 4/1987 | Kimura et al. ......................... 108/20 |
| 4,694,213 | | 9/1987 | Gowda et al. . |
| 5,109,989 | * | 5/1992 | Kremmin et al. ................. 108/20 X |
| 5,163,651 | * | 11/1992 | Matsumoto ........................ 108/20 X |
| 5,456,134 | * | 10/1995 | Bouwer et al. .................... 108/20 X |

FOREIGN PATENT DOCUMENTS

| | | |
|---|---|---|
| 0 492 992 A2 | 7/1992 | (EP) . |
| 62043145 | 2/1987 | (JP) . |
| 534398 | 12/1993 | (JP) . |
| 7138757 | 5/1995 | (JP) . |

* cited by examiner

*Primary Examiner*—Jose V. Chen
(74) *Attorney, Agent, or Firm*—Greg Leitich

(57) ABSTRACT

A movable stage assembly suitable for use in a vacuum has three circular stages rotating independently of one another. The stage assembly includes a base and a large rotatable circular table mounted on the base. This large table has a second smaller circular table which is eccentrically mounted within the first large table and rotates independently. This second table also has a smaller third circular table eccentrically mounted on it and independently rotatable within the second table. All the rotatable tables utilize ferrofluidic seals to prevent air within the air bearings from leaking into the vacuum chamber and are driven by motors mounted beneath the tables.

29 Claims, 4 Drawing Sheets

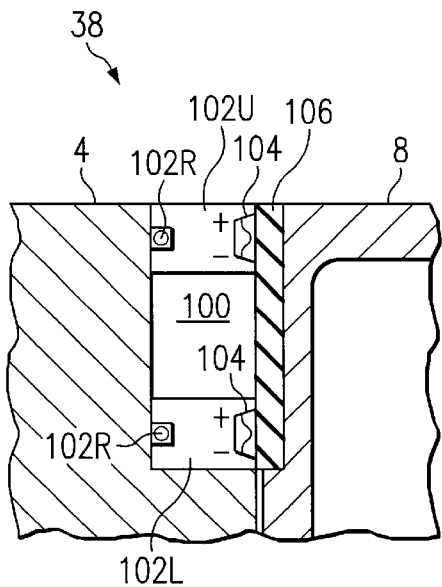
(Detail A)
FIG. 2B-A
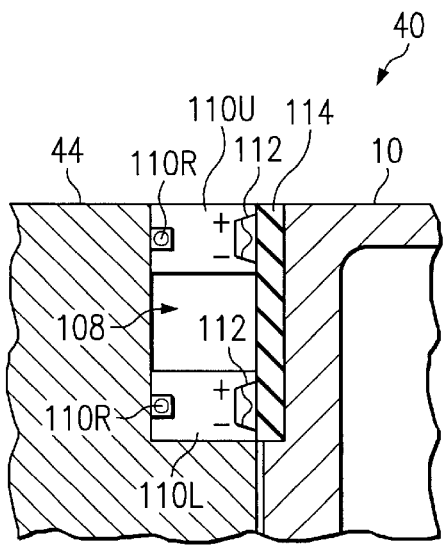
(Detail B)
FIG. 2B-B
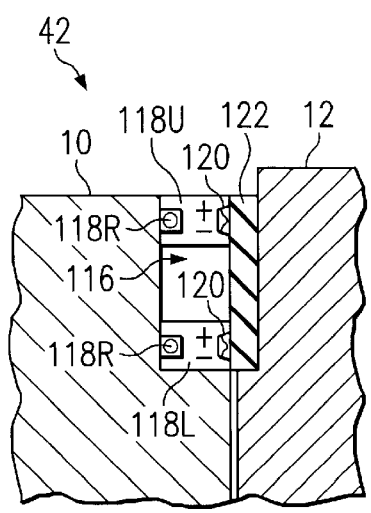
(Detail C)
FIG. 2B-C
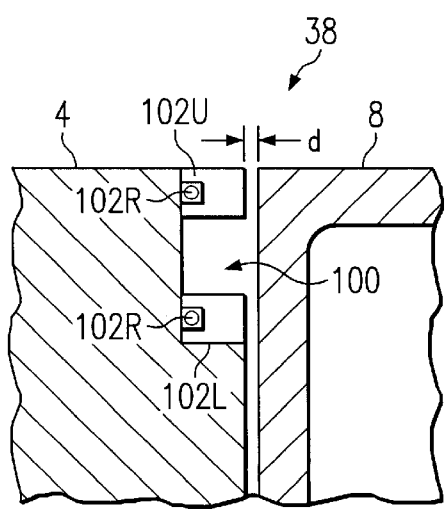
(Detail D)
FIG. 2B-D

EPICYCLIC STAGE

BACKGROUND

1. Field of the Invention

This invention relates to movable stages and other precision location mechanisms and more particularly to a stage with multiple rotating tables on air bearings.

2. Description of Related Art

Movable stage systems are typically used in many applications where precise two-dimensional movement is required to position an object supported on a stage, e.g., in high resolution lithography applications. Such movable stages typically progress linearly on linear races and bearings and are conventionally driven along both the X and Y axes. Typically this is accomplished by linear motors or actuators; a first set of linear actuators providing the X direction motion and a second set of linear actuators providing the orthogonal Y direction motion. For instance, the stage powered by linear motors may be moved back and forth in the Y direction on a mechanical guide beam which in turn is moved and powered by linear motors in the X direction along guide rails. This provides the desired independent two direction motion.

Such a stage supports, for instance, a mask blank or other workpiece so that the workpiece is precisely positioned for lithography. Similar arrangements are used in other lithographic applications, for instance, for defining conductive patterns on a laminate workpiece which is a substrate for a printed circuit board. Typically, a chuck is located on a stage or other holding mechanism arrangement for holding the workpiece. Conventional stages used for electron beam lithographic applications present several problems because they typically require the use of bellows, thin gap seals, or other mechanisms operating inside a vacuum to enclose the electron beam. Some of these problems include limited stage travel, vibration from the bellows, and poor positioning resolution partly due to thermal expansion of materials such as the guide rails or holding mechanisms heated up by the motors. Therefore, there is a need for a movable stage having minimal vibration with smooth and large effective travel, useful but not limited to electron beam lithography applications.

SUMMARY

In accordance with the invention, the above problems are overcome by a movable stage assembly which has three preferably circular stages rotating independently of one another. Because certain applications such as electron beam lithography also require precise positioning resolution, the stage travel also needs to be smooth with minimal vibration. The present stage assembly includes a base and a rotatable table mounted on the base. This table has a second smaller table which is eccentrically mounted within the first table and rotates independently. This second table also has a smaller third table eccentrically mounted and independently rotatable within the second table.

All three tables, in one embodiment, rotate on air or conventional bearings but are used in a vacuum chamber. Atmospheric air, or the air within the air bearings, is prevented from entering the vacuum by ferrofluidic seals which allow the rotation of all the tables. These ferrofluidic seals are further maintained by differential pumpouts which are attached to all three seals around all three tables. Alternatively, air can be kept out of the vacuum chamber by using, e.g., a thin gap differentially pumped seal. Additionally, the three tables are driven by axial servo motors which are mounted beneath the tables. Edge capstan drives, built-in motors, or other suitable drives may be used instead of the axial motors. An alternative embodiment of the stage assembly includes an additional fourth and fifth table which are mounted within the first table and coplanar to second and third tables. The fourth table is mounted within the first table, and the fifth table is mounted within the fourth table and operates similarly to the second and third tables.

The stage assembly presents several distinct advantages. One advantage is the ability of the stage assembly to move workpieces within the vacuum chamber while keeping all the relevant mechanisms, e.g., motors, races, bearings, hoses, etc., outside the vacuum and in atmosphere without requiring bellows. This eliminates friction problems, generation of debris, and simplifies heat dissipation from guides, motors, and bellows life problems. Another advantage relates to the stage assembly's compact size. Non-vacuum applications enable the stage to be made thinner and with less material in resisting stresses and deflections from atmospheric pressure. This results in a more compact design than conventional stages or robotic arms. In such conventional stages and robotic mechanisms, individual axis controls are typically stacked one on top of the other; however, in the present assembly, the different axes are coplanar. Finally, the compact design gives rise to the possibility of using a single stage assembly to move several workpieces within a chamber. This is an advantage if utilizing multiple electron beam columns in the same chamber.

BRIEF DESCRIPTION OF THE DRAWINGS

FIGS. 2B-A, 2B-B, and 2B-C are side views of Details A, B, and C respectively, of the rotary seals of FIG. 2A. FIG. 2B-D shows an alternative "thin gap" seal.

Use of the same reference symbols in different figures indicates similar or identical items.

DETAILED DESCRIPTION

Figure 1:
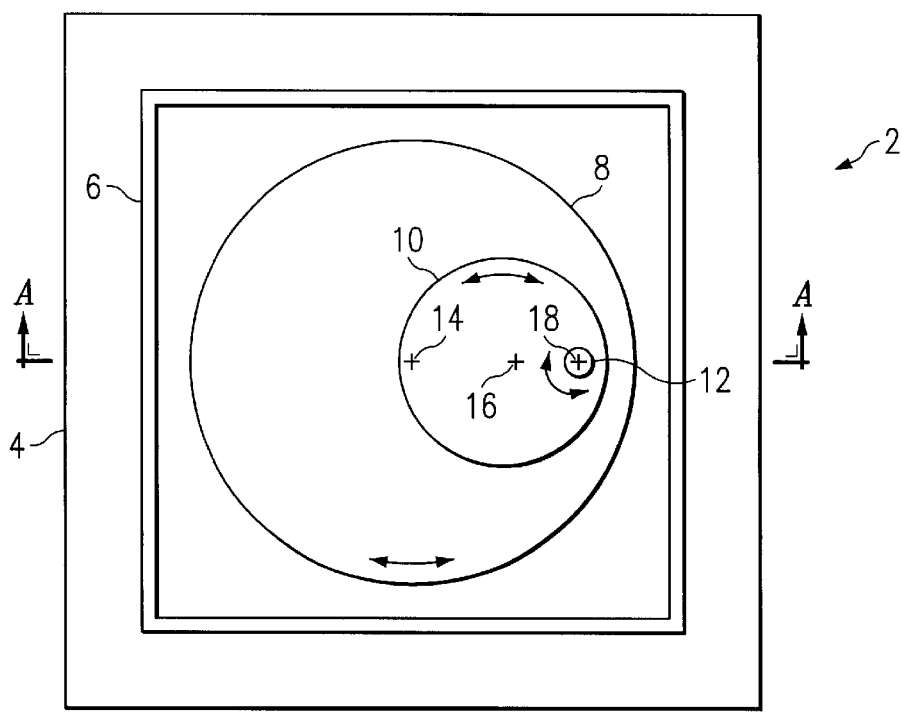
FIG. 1 is a top plan view of the present stage assembly.

A movable stage having a large travel capability with minimized vibration and vacuum compatibility is described. This is achieved with the use of several eccentrically rotating tables mounted on a base. In FIG. 1 a top view of one embodiment of stage assembly 2 is shown. In serving as a movable stage, first and second circular tables 8, 10, respectively, are used for the X-Y positioning while third circular table 12 is used to adjust for stage yaw. Stage yaw occurs during rotation of first and second circular tables 8, 10 because there are no mechanical links to maintain a constant spatial orientation of table 10, so table 12 corrects for this by use of, e.g., servo motor 36. Servo motor 36 derives its yaw-correction signals from a set of conventional laser positioning sensors (X/yaw-position laser sensors 70 seen in FIG. 3). In FIG. 1, the arrows on stage assembly 2 illustrate the direction of rotation of first, second, and third circular tables 8, 10, 12, respectively. In electron beam lithography applications, a top surface of all three tables 8, 10, 12 lie within vacuum chamber 6. It is, however, still within the scope of this invention to utilize stage assembly 2 for non-vacuum applications. Base 4 is of a conventional material having physical properties which are stable over a wide range of thermal and vibrational conditions, e.g., granite.

Figure 2A:
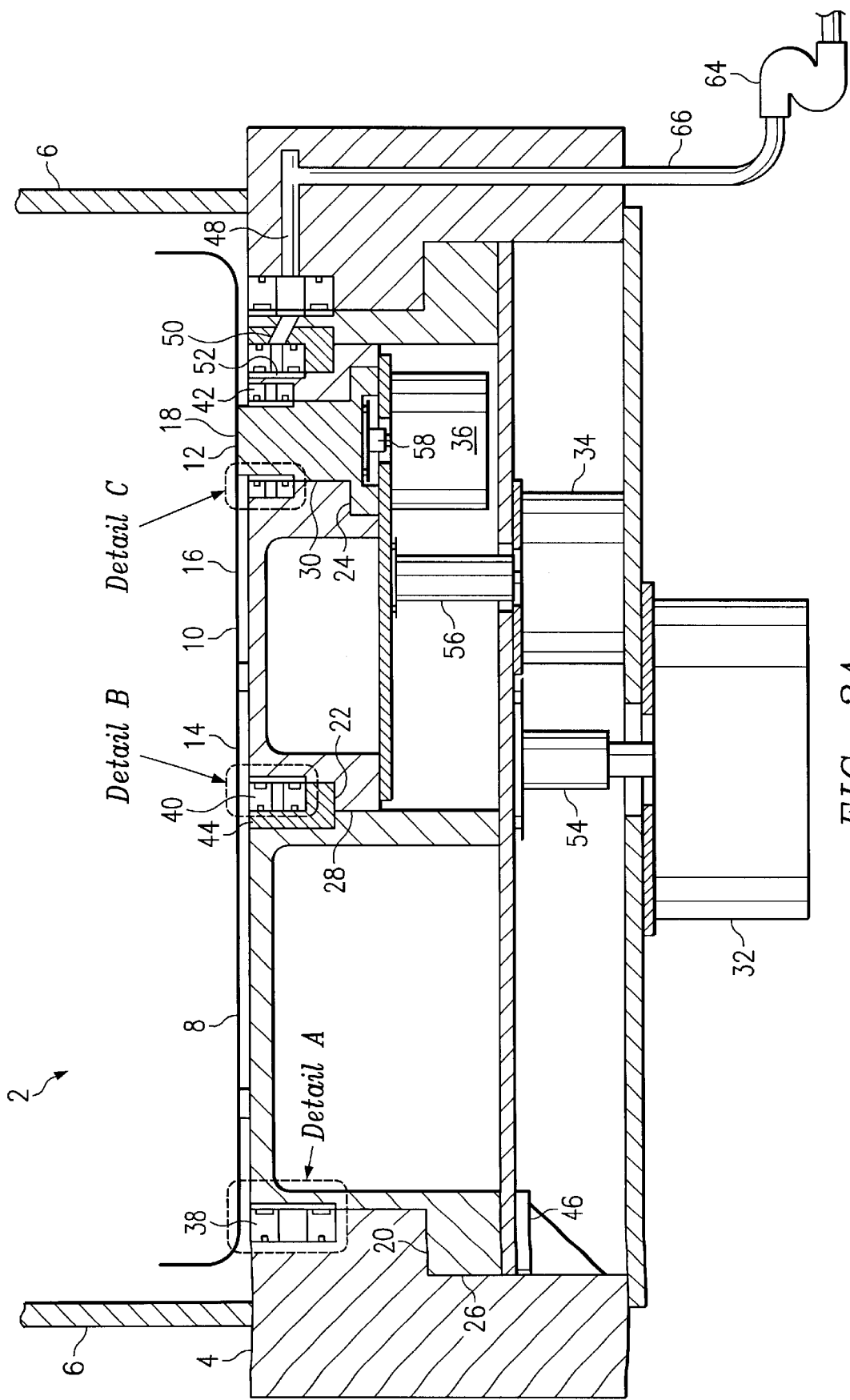
FIG. 2A is a side view of a cross section of FIG. 1 of the stage assembly.

First circular table 8 is mounted upon base 4 such that it rotates about first center 14. Mounted within first circular table 8 is second circular table 10 which rotates about second center 16. Second circular table 10 has a diameter that is smaller than that of first circular table 8 and is mounted eccentrically within first circular table 8 such that first center 14 lies within the area of second circular table 10; however, it is also within the scope of this invention to have first center 14 lie outside the area of second circular table 10 in another embodiment. Third circular table 12, also called a spindle, has a diameter which is smaller than that of second circular table 10; it also lies within the area of second circular table 10 and rotates about third center 18. Third circular table 12 is likewise also mounted eccentrically within the area of second circular table 10. As first circular table 8 can rotate about first center 14, second circular table 10 rotates about second center 16 independently of the rotation of first circular table 8. Third circular table 12 rotates about third center 18 independently of the rotation of either first or second circular tables 8, 10, respectively. In one embodiment first circular table 8 has a radius of 14.25 inches and second circular table 10 has a radius of 6.4 inches. In another larger embodiment, first circular table 8 has a radius of 28.5 inches and second circular table 10 has a radius of 12.8 inches FIG. 2A is a side view (along cross section A—A) of stage assembly 2 in FIG. 1. As shown, first circular table 8 rotates within base 4 while traveling on first air bearing 20 and first radial air bearing 26. First air bearing 20 is an axial cushion of air supplied via outlet ports from a supply of compressed air and which allows for the rotation of first circular table 8 with no surface contact between first circular table 8 and base 4. First radial shaped air bearing 26 provides a radial cushion of air for the rotation along the outer circumference of first circular table 8; both first air bearing 20 and first radial air bearing 26 provide rotation with no surface contact and minimal friction. Auxiliary support air pads 46 provide axial support to carry the weight of first circular table 8 when chamber 6 is not evacuated, but air pads 46 do not provide radial guidance. To isolate first air bearing 20 and first radial air bearing 26 from vacuum, the gap between base 4 and first circular table 8 is sealed by first rotary seal 38. First rotary seal 38 extends around the circumference of first circular table 8 and seals first air bearings 20, 26 from the vacuum environment in vacuum chamber 6. (The air supply channels and ports for the air bearings and air pads are conventional and not shown for simplicity.) Although the use of air for the bearings and pads is described in this embodiment, this does not preclude the use of other bearing fluids in other embodiments of this invention.

First rotary seal 38, in one embodiment, consists of a set of two ferrofluidic seals 102U, 102L separated by partially-evacuated cavity 100, as shown in Detail A in FIG. 2B-A which is a close-up cross-sectional view of the ferrofluidic first rotary seal 38. Such seals may be purchased from Ferrofluidics Corp., Nashua, NH. A ferrofluidic seal generally consists of a magnet and pole pieces which, together with the bearing shaft (which is of magnetic material), form a complete magnetic circuit (see, e.g., U.S. Pat. No. 4,694, 213 incorporated by reference describing such seals). The circuit includes a small gap between the pole pieces and the bearing shaft in which an intense magnetic field is produced by the magnet. This field traps a ferrofluid (a magnetic fluid with a low-vapor pressure fluid containing colloidal magnetic particles) and retains it in position in the gap. The ferrofluid bridges the gap and forms a physical barrier which prevents the lubricant, the lubricant being air in one embodiment, from entering vacuum chamber 6. The ferrofluidic seals also have the advantage of viscous damping from vibrations incurred during rotation. First upper seal 102U, which is made of a magnetized material, is located above first cavity 100 and first lower seal 102L, which is also magnetic, is located below. Ferrofluid 104 is held within gaps between first seals 102U, 102L and first magnetic sleeve 106 collectively by the magnetic circuit between first seals 102U, 102L and first magnetic sleeve 106. Also, the partial vacuum within cavity 100 is maintained by O-rings 102R, which are held within first seals 102U, 102L. First magnetic sleeve 106 is made of a magnetic (not magnetized) material; and in another embodiment, a magnetic bearing shaft can be used rather than magnetic sleeve 106 to complete the magnetic circuit. First rotary seal 38 prevents the air in first air bearings 20, 26 from reaching vacuum chamber 6.

To rotate first circular table 8, first servo motor 32 is axially mounted in one embodiment beneath first center 14 and coupled to table 8 by first shaft 54. In another embodiment, an edge capstan drive (not shown) mounted beneath first circular table 8 provides the power to rotate first circular table 8. First servo motor 32 in one embodiment is approximately 1/35 Hp at 4 rpm to provide adequate motor torque. This motor torque would rotate first circular table 8 weighing, for example, approximately 108 lbs. with a moment of inertia (only of first circular table 8) of about 65 in·lb·sec$^2$ at a maximum angular acceleration of about 8 radians/sec$^2$ with approximately 520 in·lbs torque. The above example of table 8 and motor 32 is only for illustrative purposes and is not meant to limit the scope of the invention.

Second circular table 10 rotates within first circular table 8 and similarly rotates on second air bearing 22 and second radial air bearing 28. Air bearings 22, 28 operate in the same manner as air bearings 20, 26, respectively, as described above by providing a cushion of air, in one embodiment, for second circular table 10 to rotate upon. The air bearings associated with second circular table 10 are further isolated by second rotary seal 40 which in one embodiment is a ferrofluidic seal, of the type described above for first rotary seal 38. Additionally, second rotary seal 40 is further supported by bearing holder 44 which circumferentially surrounds second rotary seal 40 and provides an additional support. Detail B in FIG. 2B-B is a close-up view of the ferrofluidic second rotary seal 40 which is similar to the seal in Detail A. Second upper seal 110U is also located above second cavity 108 and second lower seal 110L is located below. Both second seals 110U, 110L are made of a magnetic material and have been magnetized. Ferrofluid 112 is held within gaps between second seals 110U, 110L and second magnetic sleeve 114 by the magnetic circuit between second seals 110U, 110L, second magnetic sleeve 114. Similarly in another embodiment, second circular table 10 acts as the bearing shaft and is made of a magnetic material to replace second magnetic sleeve 114. As described above, the partial vacuum within second cavity 108 is maintained by O-rings 110R, which are held within second seals 110U, 110L. Second rotary seal 40 prevents the loss of the air from second air bearings 22, 28 from escaping into vacuum chamber 6. Furthermore, in one embodiment, second servo motor 34 is axially mounted below second center 16 to provide the necessary torque to rotate second circular table 10 about second center 16 and is coupled to second table 10 by second shaft 56. In another embodiment, an edge capstan drive (not shown) provides the motor torque to rotate second circular table 10.

Third circular table 12 rotates within second circular table 10 and similarly rotates on third air bearing 24 and third radial air bearing 30 in much the same manner as first and second circular tables 8, 10 rotate on their respective air bearings, as described above. Third circular table 12 has associated with it third rotary seal 42 which in one embodiment is a ferrofluidic seal as described above for first and second rotary seals 38, 40, respectively. Similar to Details A and B above, Detail C in FIG. 2B-C is a close-up view of the ferrofluidic third rotary seal 42. Third upper seal 118U is located above third cavity 116 and third lower seal 118L is located below. Ferrofluid 120 is held within gaps between third seals 118U, 118L and third magnetic sleeve 122 by the magnetic circuit between third seals 118U, 118L and third magnetic sleeve 122. Third circular table 12, in another embodiment, acts as the bearing shaft and is made of a magnetic material. The partial vacuum within third cavity 116 is maintained by O-rings 118R, which are held within third seals 118U, 118L. Third rotary seal 42 prevents the escape of the lubricating air from third air bearing 24, 30 into vacuum chamber 6. Also, third circular table 12 is rotated by third servo motor 36 which is coupled thereto by third shaft 58 and corrects for yaw during stage rotation. However, as for first and second circular tables 8, 10, respectively, third servo motor 36 is exemplary and does not preclude the use of other types of motors, such as edge capstan drives or motors integrally built into rotating tables 8,10,12 (edge capstan drive and integral motors are not shown) in other embodiments.

In using ferrofluidic seals in one embodiment for first, second, and third rotary seals 38, 40, 42, respectively, small bubbles accumulate within the ferrofluid over time and can be problematic if they leak into vacuum chamber 6. This process of leaking into the vacuum is conventionally known as "burping" and is prevented by having conventional pump 64 pump out the small bubbles through intermediate cavities 100, 108, 116 through, e.g., tubing 66. Having an intermediate partial vacuum within cavities 100, 108, 116 between the vacuum of chamber 6 and the high pressure within air bearings 20 to 30 helps minimize the risk of burping. First differential pumpout 48 is shown in FIG. 2A connected to cavity 100, which is then connected to cavity 108 through pumpout 50, and also connected to cavity 116 through pumpout 52. Differential pumpout 48 provides differential pumping to seals 38, 40, 42. Differential pumping is optional for stage operation and can thus be eliminated in another embodiment or used only on first rotary seal 38 in yet another embodiment or on seals 38 and 40. In an alternate embodiment, the ferrofluidic seals can be altogether eliminated. An example is shown in Detail D of FIG. 2B-D which is similar to Detail A of FIG. 2B-A in all respects except first magnetic sleeve 106 and ferrofluid 104 have been eliminated. The elimination of the ferrofluidic seals is done by making gap d between seals 102U, 102L and the corresponding shaft, in this instance first table 8, sufficiently small, e.g., less than 0.0005 inches.

Figure 3:
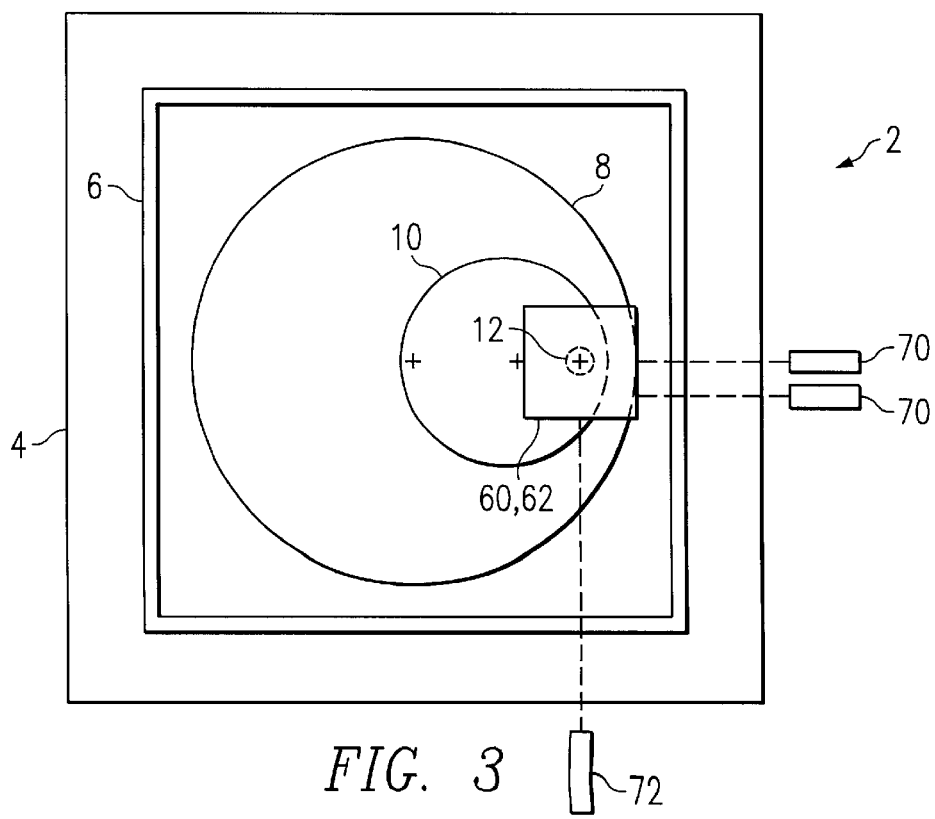
FIG. 3 is a top plan view of the stage assembly with a work table attached to the third circular table.
Figure 4:
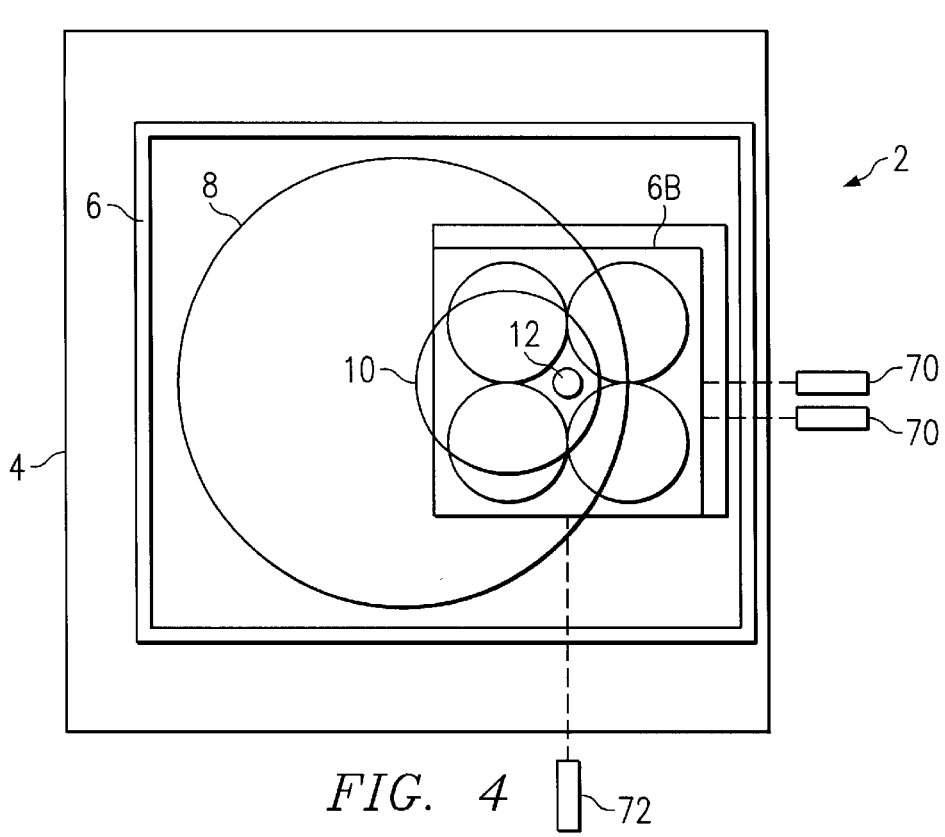
FIG. 4 is a top plan view of the stage assembly with a work table attached to the third circular table with several semiconductor wafers.

FIG. 3 illustrates a plan view of stage assembly 2 with work table 60 attached and substrate (workpiece) 62 mounted thereon. Work table 60 is attached in one embodiment to third circular table 12 and configured to hold substrate 62 depending upon what type of substrate is worked on. Substrate 62 is, e.g., a mask, or a semiconductor wafer, for lithography applications. Conventional laser positioning sensors, X and yaw-position sensors 70 and Y-position sensor 72, are used to generate signals for conventional motion control algorithms for positioning workpiece 62 by controlling the positions of first, second, and third tables 8, 10, 12 in relation to the position of workpiece 62. FIG. 4 shows the same stage assembly 2 except configured to simultaneously hold substrate 68 with several semiconductor wafers for lithography applications.

Figure 5:
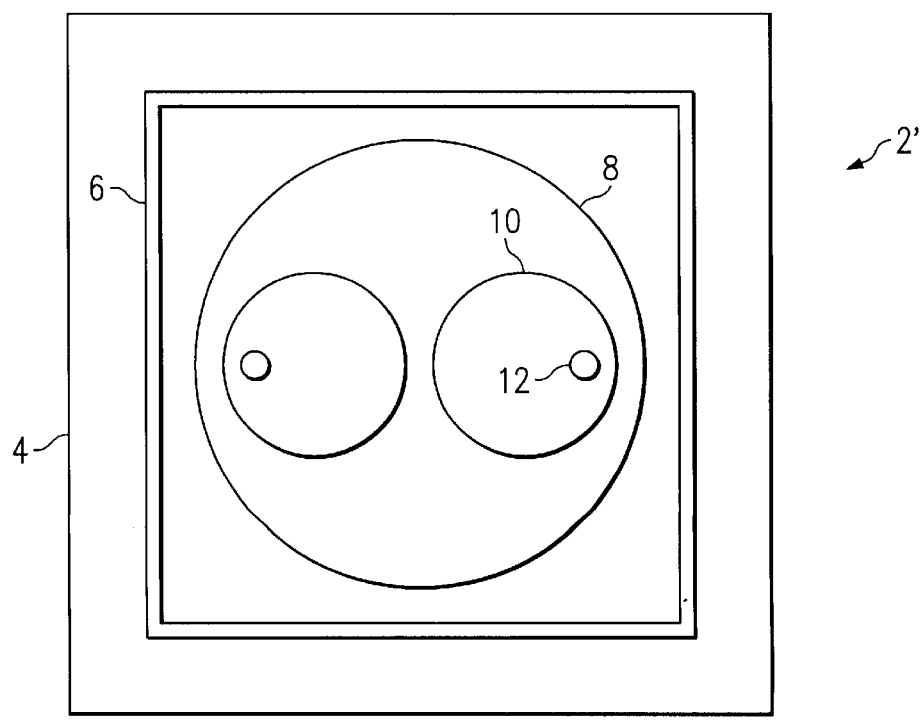
FIG. 5 is a top plan view of an alternate embodiment of the present stage assembly.

FIG. 5 illustrates an alternative embodiment for stage assembly 2'. It is similar in all respects to stage assembly 2, but with an additional fourth table 10' and an additional fifth table 12' both located on first table 8 and coplanar to second and third tables 10, 12, respectively. Stage assembly 2' operates in the same manner as assembly 2, as described above, but with the additional capacity to hold more workpieces.

As discussed above, the independent rotation of first, second, and third circular tables 8, 10, 12, respectively, allows for the extremely large effective travel of work table 60, which could be mounted on third circular table 12, to hold work pieces or substrate 62, in an extremely compact configuration. The use of air bearings 20 to 30 also allow for smooth travel and for low moving forces which first, second, and third servo motors 32, 34, 36 are required to generate. Also, the rotating tables eliminate the need for guide rails or drive bars for stage positioning, as well as motors or any mechanisms directly within vacuum chamber 6; this in turn eliminates the degradation in positioning resolution which occurs from thermal expansion of stage materials and debris formation.

Although the invention has been described with reference to particular embodiments, the description is only an example of the invention's application and should not be taken as a limitation. In particular, even though much of preceding discussion was of air bearings and ferrofluidic seals, alternative embodiments of this invention include bearings and rotary seals utilizing different fluids. Various other adaptations and combinations of features of the embodiments disclosed are within the scope of the invention as defined by the following claims.

I claim:

1. A stage assembly, comprising:
   a base;
   a first table rotatably mounted on said base;
   a second table rotatably and eccentrically mounted on said first table; and
   a third table rotatably and eccentrically mounted on said second table and adapted to adjust for stage yaw.

2. The stage assembly of claim 1, wherein each of said first, second, and third tables are circular.

3. The stage assembly of claim 1, wherein said base is comprised of granite.

4. The stage assembly of claim 1, further comprising a work table mounted on said third table.

5. The stage assembly of claim 1, further comprising:
   a first fluid bearing disposed between said base and said first table;
   a second fluid bearing disposed between said first and said second tables; and
   a third fluid bearing disposed between said second and said third tables.

6. The stage assembly of claim 5, wherein each of said fluid bearing is an air bearing.

7. The stage assembly of claim 1, wherein said stage is in a vacuum chamber and further comprising a rotary fluid seal surrounding a circumference of each of said first, second, and third tables.

8. The stage assembly of claim 7, wherein said rotary fluid seal includes a ferrofluid.

9. The stage assembly of claim 8, wherein each of said rotary fluid seals includes a source of magnetic or electromagnetic force.

10. The stage assembly of claim 7, further comprising a differential pumpout chamber in communication with each of said rotary fluid seals.

11. The stage assembly of claim 10, further comprising a pump in communication with each of said differential pumpout chambers.

12. The stage assembly of claim 1, further comprising a first, second, and third servomotor each coupled to an associated one of said tables.

13. The stage assembly of claim 1, further comprising a first, second, and third edge capstan drive each coupled to an associated one of said tables.

14. An epicyclic stage assembly, comprising:
a base;
a first circular table rotatably mounted on said base;
a second circular table rotatably and eccentrically mounted on said first circular table;
a third circular table rotatably and eccentrically mounted on said second circular table and adapted to adjust for stage yaw;
a work table mounted on said third circular table;
a rotary seal surrounding a circumference of each of said first, second, and third circular tables, said rotary seals each comprising:
 a ferrofluid maintained by a differential pump; and
 a source of a magnetic or electromagnetic force which maintains said ferrofluid around each of said first, second, and third circular tables;
an air bearing disposed between said base and said first circular table, between said first and said second circular tables, and between said second and said third circular tables; and
a motor coupled to each of said first, second, and third circular tables.

15. A method of positioning a work piece on a assembly, comprising:
rotating a first table on a base;
rotating a second table which is eccentrically mounted on said first table; and
rotating a third table which is eccentrically mounted on said second table, thereby positioning said workpiece located on said third table and adjusting for stage yaw.

16. The method of claim 15, wherein each of said first, second, and third tables are circular.

17. A stage assembly, comprising:
a base;
a first table rotatably mounted on said base;
a second table rotatably and eccentrically mounted on said first table;
a third table rotatably and eccentrically mounted on said second table and adapted to adjust for stage yaw;
a fourth table rotatably and eccentrically mounted on said first table; and
a fifth table rotatably and eccentrically mounted on said fourth table.

18. The stage assembly of claim 17, wherein each of said first, second, third, fourth, and fifth tables are circular.

19. The stage assembly of claim 17, wherein said base is comprised of granite.

20. The stage assembly of claim 17, further comprising work tables mounted on each said third and fifth tables.

21. The stage assembly of claim 17, further comprising:
a first fluid bearing disposed between said base and said first table;
a second fluid bearing disposed between said first and said second tables;
a third fluid bearing disposed between said second and said third tables;
a fourth fluid bearing disposed between said first and said fourth tables; and
a fifth fluid bearing disposed between said fourth and said fifth tables.

22. The stage assembly of claim 21, wherein each of said fluid bearing is an air bearing.

23. The stage assembly of claim 17, wherein said stage is in a vacuum chamber and further comprising a rotary fluid seal surrounding a circumference of each of said first, second, third, fourth, and fifth tables.

24. The stage assembly of claim 23, wherein said rotary fluid seal includes a ferrofluid.

25. The stage assembly of claim 24, wherein each of said rotary fluid seals includes a source of magnetic or electromagnetic force.

26. The stage assembly of claim 23, further comprising a differential pumpout chamber in communication with each of said rotary fluid seals.

27. The stage assembly of claim 26, further comprising a pump in communication with each of said differential pumpout chambers.

28. The stage assembly of claim 17, further comprising a first, second, third, fourth, and fifth servomotor each coupled to an associated one of said tables.

29. The stage assembly of claim 17, further comprising a first, second, third, fourth, and fifth edge capstan drive each coupled to an associated one of said tables.

* * * * *